United States Patent
Choi et al.

(10) Patent No.: US 11,251,093 B2
(45) Date of Patent: Feb. 15, 2022

(54) POLY GATE EXTENSION DESIGN METHODOLOGY TO IMPROVE CMOS PERFORMANCE IN DUAL STRESS LINER PROCESS FLOW

(71) Applicant: Texas Instruments Incorporated, Dallas, TX (US)

(72) Inventors: Younsung Choi, Plano, TX (US); Steven Lee Prins, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 28 days.

(21) Appl. No.: 16/931,818

(22) Filed: Jul. 17, 2020

(65) Prior Publication Data

US 2020/0350210 A1 Nov. 5, 2020

Related U.S. Application Data

(60) Continuation of application No. 16/167,903, filed on Oct. 23, 2018, now Pat. No. 10,734,290, which is a continuation of application No. 15/409,842, filed on Jan. 19, 2017, now Pat. No. 10,134,643, which is a division of application No. 14/576,659, filed on Dec. 19, 2014, now Pat. No. 9,583,488.

(60) Provisional application No. 61/921,959, filed on Dec. 30, 2013.

(51) Int. Cl.
*H01L 21/8238* (2006.01)
*H01L 27/092* (2006.01)
*H01L 29/78* (2006.01)
*H01L 29/423* (2006.01)
*H01L 27/02* (2006.01)

(52) U.S. Cl.
CPC ........... *H01L 21/82385* (2013.01); *H01L 21/823807* (2013.01); *H01L 21/823828* (2013.01); *H01L 27/0207* (2013.01); *H01L 27/092* (2013.01); *H01L 29/4238* (2013.01); *H01L 29/42376* (2013.01); *H01L 29/7843* (2013.01)

(58) Field of Classification Search
CPC combination set(s) only.
See application file for complete search history.

(56) References Cited

U.S. PATENT DOCUMENTS

2004/0180522 A1  9/2004  Nishida
2009/0280645 A1  11/2009  Lee

FOREIGN PATENT DOCUMENTS

WO  2006058560  6/2006

OTHER PUBLICATIONS

Google Search results for "overhang of active", May 10, 2016.
Uyemura, John P., Circuit Design for CMOS VLSI, 1992, Springer Science & Business Media, p. 220-230.

*Primary Examiner* — Selim U Ahmed
*Assistant Examiner* — Evan G Clinton
(74) *Attorney, Agent, or Firm* — Jacqueline J. Garner; Charles A. Brill; Frank D. Cimino

(57) ABSTRACT

An integrated circuit and method with dual stress liners and with NMOS transistors with gate overhang of active that is longer than the minimum design rule and with PMOS transistors with gate overhang of active that are not longer than the minimum design rule.

18 Claims, 4 Drawing Sheets

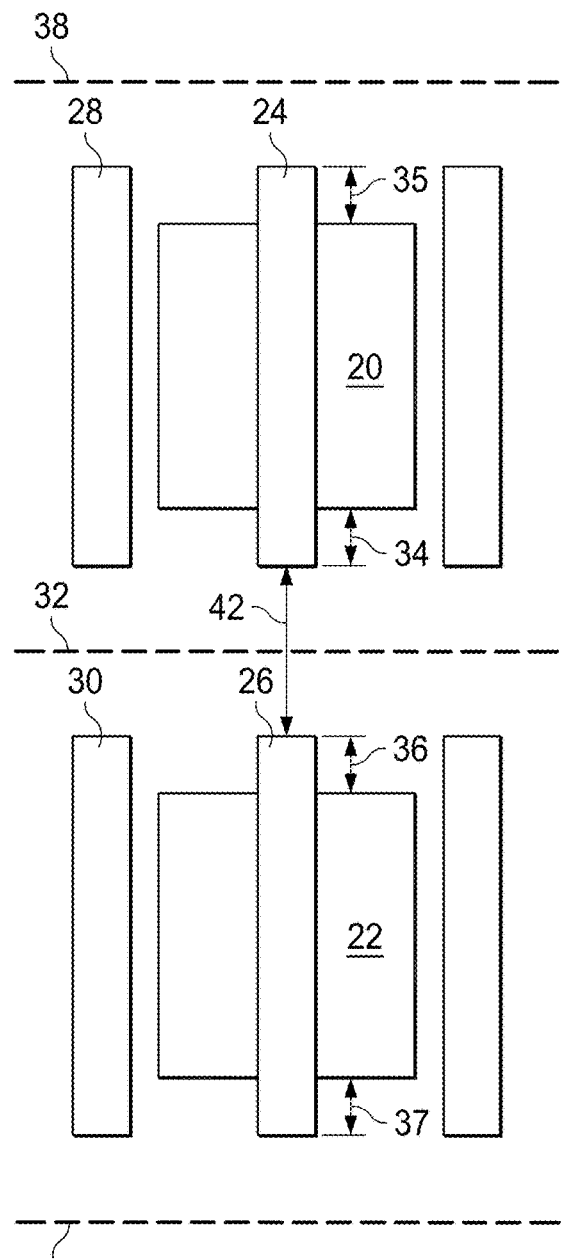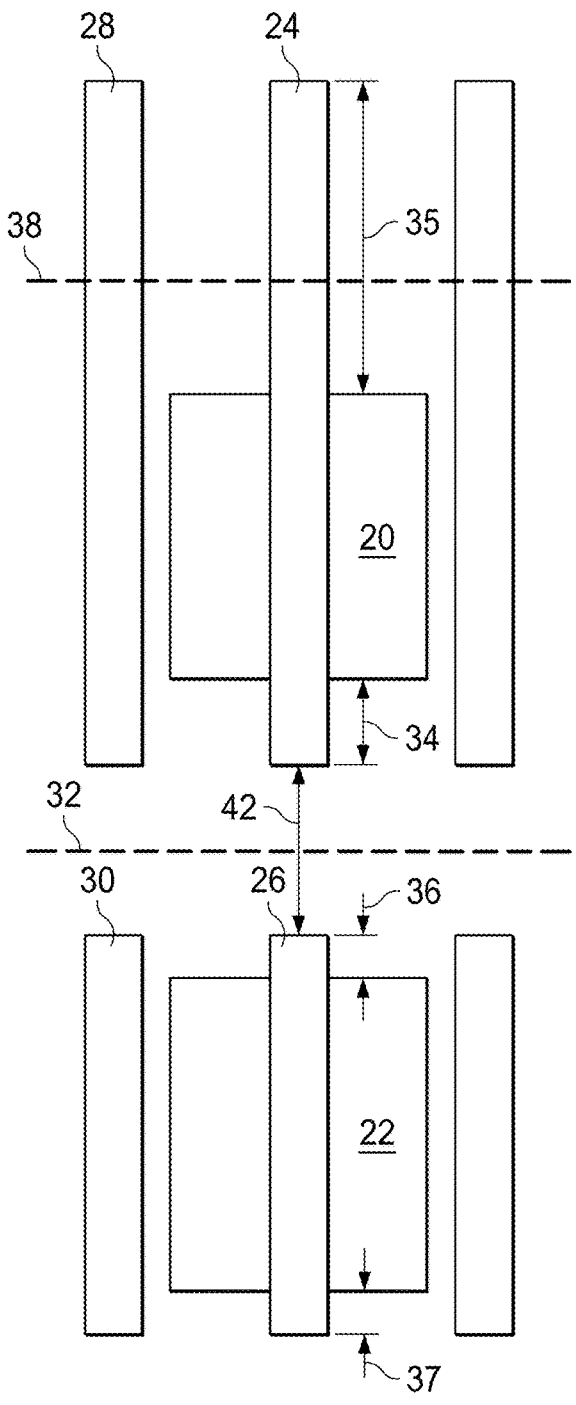
FIG. 1
FIG. 3

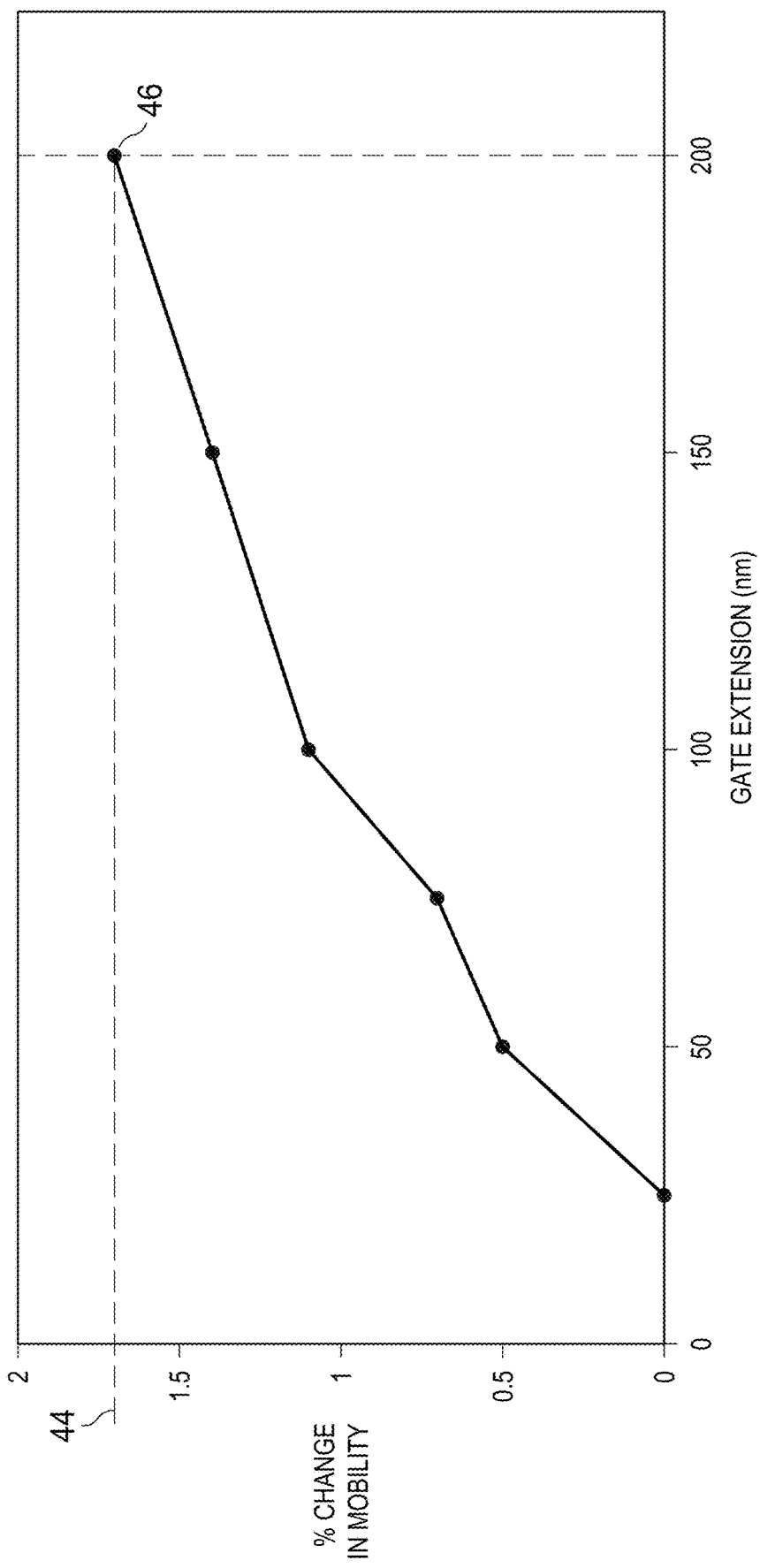

POLY GATE EXTENSION DESIGN METHODOLOGY TO IMPROVE CMOS PERFORMANCE IN DUAL STRESS LINER PROCESS FLOW

CROSS-REFERENCE TO RELATED APPLICATIONS

This application is a continuation of U.S. Nonprovisional patent application Ser. No. 16/167,903, filed Oct. 23, 2018, which is a continuation of Ser. No. 15/409,842, filed Jan. 19, 2017 (now U.S. Pat. No. 10,134,643), which is a divisional of U.S. Nonprovisional patent application Ser. No. 14/576,659 (now U.S. Pat. No. 9,583,488), filed Dec. 19, 2014, which claims the benefit of U.S. Provisional Application Ser. No. 61/921,959, filed Dec. 30, 2013, the contents of all of which are herein incorporated by reference in its entirety.

FIELD OF INVENTION

This invention relates to the field of integrated circuits. More particularly, this invention relates to CMOS transistors with enhanced performance.

BACKGROUND

As design rules in CMOS technology have scaled into the deep submicron regime, the performance of CMOS transistors has failed to keep pace. This is due to lower power supply voltages, to higher channel doping (increased series resistance) to reduce short channel effects, and due to reduced scaling of the transistor channel length.

Stress is now commonly used to improve transistor performance. Compressive stress when applied parallel to the current flow increases hole mobility for PMOS transistors thus improving PMOS transistor performance. Tensile stress when applied parallel to the current flow increases electron mobility in NMOS transistors improving performance. Since opposite type stress is required to enhance performance of NMOS and PMOS transistors, dual stress liner (DSL) technology has been developed to put a film with tensile stress over NMOS transistors and with compressive stress over PMOS transistors. In a DSL flow, a tensile silicon nitride film is deposited, patterned, and etched to leave the tensile liner over the NMOS transistors to enhance electron mobility in the NMOS transistor channels. A compressive silicon nitride film is then deposited, patterned, and etched to leave the compressive liner over the PMOS transistors to enhance hole mobility in the PMOS transistor channels.

Compressive stress when applied perpendicular to the current flow degrades both hole and electron mobility and therefore degrades performance of both NMOS and PMOS transistors. Tensile stress when applied perpendicular to the current flow improves both hole and electron mobility and therefore enhances performance of both NMOS and PMOS transistors. The position of the DSL boundary with respect to the transistor channel may be optimized to minimize the negative impact upon NMOS and PMOS transistor performance. Often the position of the DSL boundary is constrained by design rules and layout.

For example, when an NMOS and PMOS transistor are vertically adjacent as shown in FIG. 1, to minimize chip area, minimum design rules for NMOS gate overhang of active 34, PMOS gate overhang of active 36, and gate tip-to-tip space 42 are used. This limits the distance the DSL boundary 32 may be moved from NMOS and PMOS transistors. Typically the DSL boundary is placed midway between the NMOS active 20 and PMOS active 22. Sometimes as is disclosed in U.S. Provisional Application 61/409,583 (Texas Instruments docket number TI-68750, filed Nov. 3, 2010) incorporated herein by reference, it may be offset to improve transistor performance.

SUMMARY

An integrated circuit and method with improved performance has NMOS transistors where the gate overhang of active is greater than the minimum design rule and where the gate overhang of active for PMOS transistors is at the minimum design rule.

BRIEF DESCRIPTION OF THE DRAWINGS

FIG. 1 Vertically adjacent NMOS and PMOS transistors.
FIG. 2 Graph of NMOS transistor electron mobility versus NMOS gate overhang of active.
FIG. 3 PMOS transistors formed according to principles of the invention.

DETAILED DESCRIPTION OF EXAMPLE EMBODIMENTS

Figure 4A:
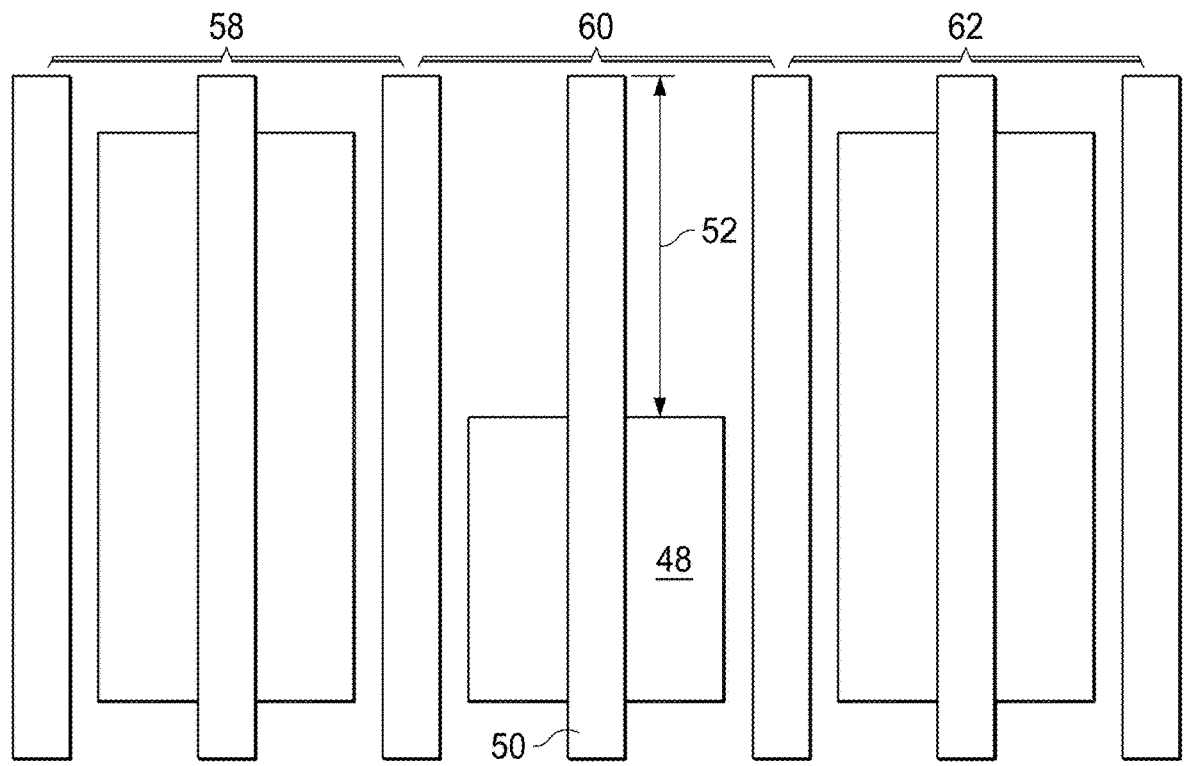
FIGS. 4A and 4B are plan views of a PMOS transistor embodiment of the principles of the invention

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows an NMOS and a PMOS transistor with a dual stress liner (DSL) boundary 32 between them. The NMOS transistor gate 24 overlies an n-active area 20. The PMOS transistor gate 26 overlies a p-active area 22. A DSL boundary 32 typically lies about midway between the NMOS and PMOS transistor active regions 20 and 22 and lies parallel to the current flow in the transistors. The gate extension or gate overhang of active for the NMOS transistor 34 and for PMOS transistors 36 are typically equal. To conserve space, minimum design rules for gate overhang of active for the NMOS 34 and PMOS 36 transistors and the minimum gate tip-to-tip space 42 are used for vertically adjacent NMOS and PMOS transistors. In an example 28 nm CMOS technology, gate overhang of active design rule for the NMOS and PMOS transistors is 25 nm, the gate tip-to-tip design rule space is 50 nm. The DSL to active design rule space is 50 nm.

In integrated circuits, the majority of transistors may not be vertically adjacent. For example, there may be open area next to many transistors in an integrated circuit above the NMOS transistor (next to DSL boundary 38) and below the PMOS transistor (next to DSL boundary 40) as is illustrated in FIG. 1 and FIG. 3.

As is shown in the graph in FIG. 2, the performance of an NMOS transistor in an integrated circuit with DSL is enhanced by increasing the NMOS gate overhang 34 and 35 of active. As shown in FIG. 2 the performance of an NMOS transistor in a 28 nm CMOS technology may be increased by more than 1.5% by extending the gate from about 25 nm overlap to about 200 nm overlap.

In an example embodiment for a 28 nm CMOS technology with the DSL boundary is 50 nm from the NMOS transistor active, increasing the NMOS gate overhang of active (35 in FIG. 1) from 25 nm to approximately 200 nm increases the mobility of the electrons in the channel by approximately 1.75% resulting in an increase of NMOS transistor drive current (performance) by approximately 1.75%.

The mobility of holes in a PMOS transistor may be improved by reducing the gate overhang of active 36 and 37. Since the PMOS gate overhang of active 36 and 37 is typically drawn at minimum design rule, little space is available for improving PMOS performance. For PMOS transistors, optimum performance is achieved by reducing the PMOS gate overhang 36 and 37 to the minimum allowed by the design rule.

As shown in FIG. 3, if the gate overhang of active for the NMOS 34 and PMOS 36 and gate tip-to-tip space 42 are not drawn at minimum design rule between the vertically adjacent NMOS and PMOS transistors, the gate overhang of active for the NMOS transistor 34 may be increased and the gate overhang of active for the PMOS transistor 36 may be decreased to improve the performance of the NMOS and PMOS transistors.

If additional space is available above the NMOS transistor the gate overhang 35 of active may be additionally extended above the NMOS transistor as shown in FIG. 3 to enhance the NMOS transistor. When the NMOS gate in a 28 nm technology is extended to about 200 nm the performance of the NMOS transistor is improved by about 1.75%. The PMOS gate overhang of active 36 and 37 may be reduced to minimum design rule to maximize PMOS transistor performance.

As shown in FIG. 4A a narrow width PMOS transistor 60 may be drawn adjacent a wide PMOS transistor 58 or transistors, 58 and 62. In these instances it is common practice to extend the gate 52 overhang of active 48 to the same gate length as the adjacent wide PMOS transistors 58 and 62 as part of optical proximity correction (OPC).

Figure 4B:
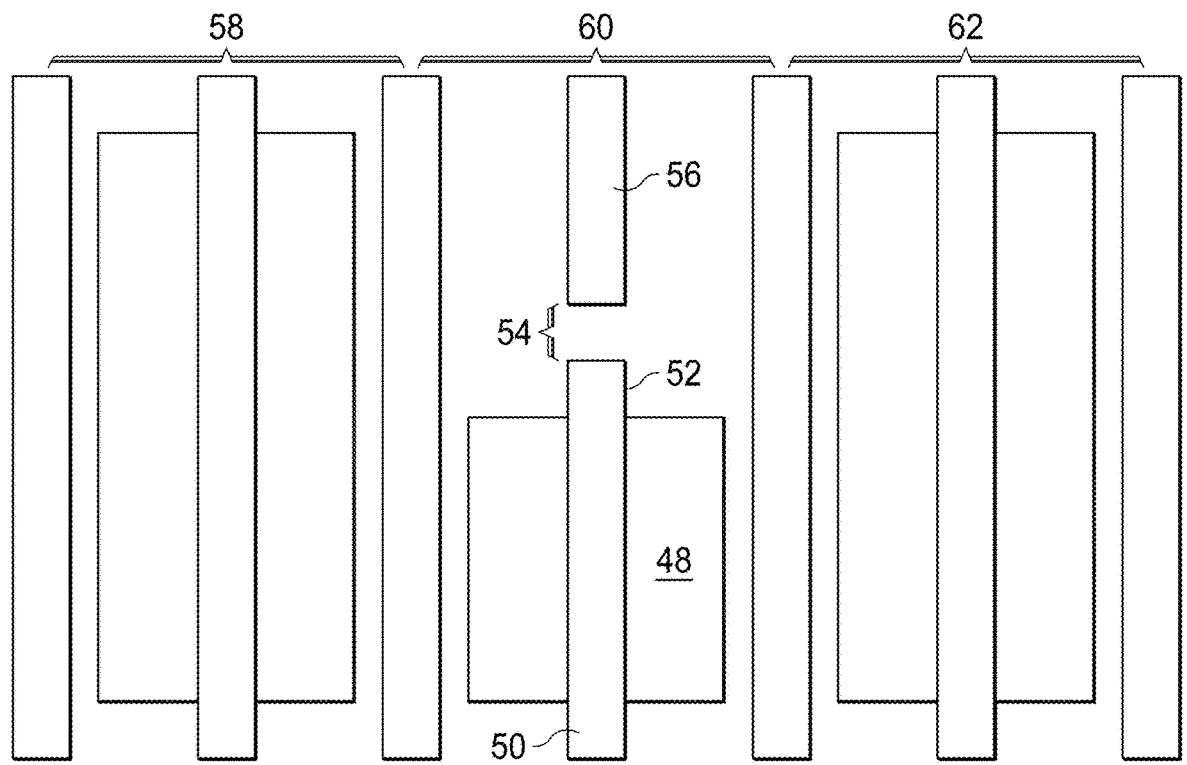

As is illustrated in FIG. 4B, the performance of the PMOS transistor 60 may be enhanced by decreasing the gate overhang 52 of active 48 to the minimum allowed by design rule and forming a OPC dummy gate extension 56. This may be accomplished by forming a gap 54 between the PMOS gate 50 and the OPC dummy gate extension 56.

Figure 5A:
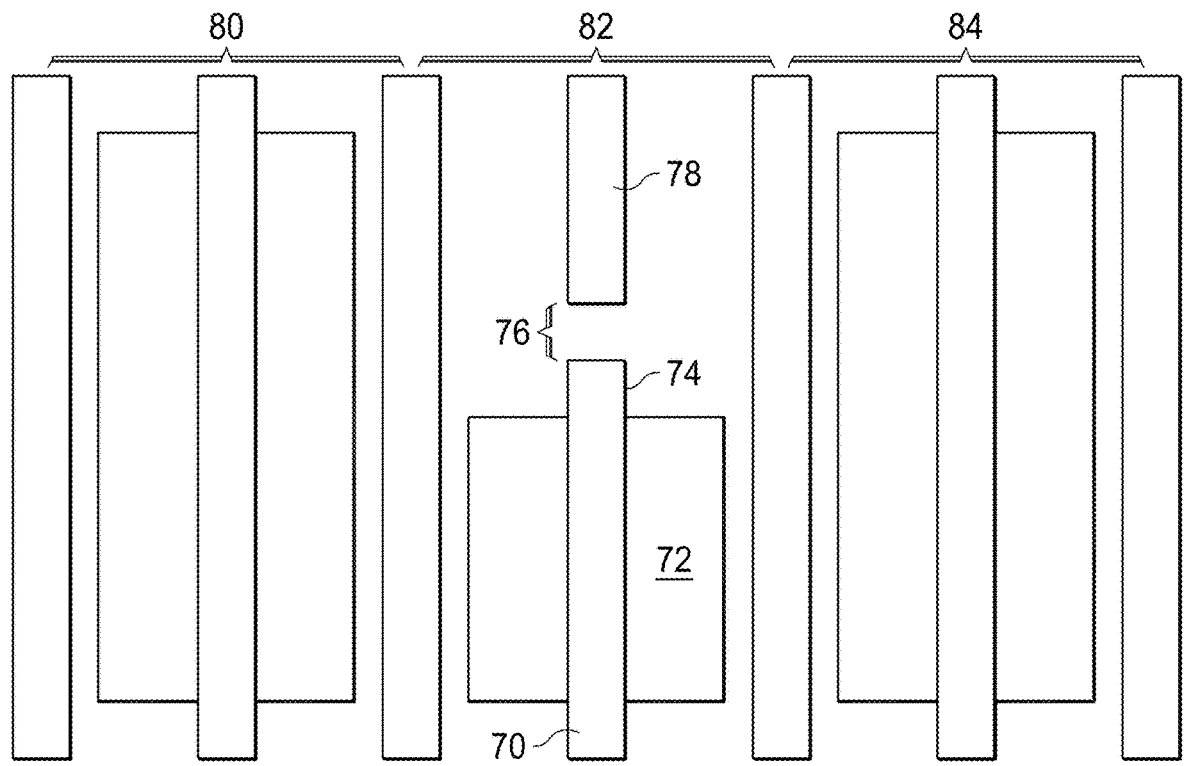
FIGS. 5A and 5B are plan views of an NMOS transistor embodiment of the principles of the invention

As shown in FIG. 5A a narrow width NMOS transistor 82 may be drawn adjacent a wide NMOS transistor 80 or transistors, 80 and 84. In these instances it is common practice to provide an OPC dummy gate extension 78 above the narrow transistor 82 gate 70 as part of the OPC correction. As shown in FIG. 5A the OPC dummy gate extension 78 may be separated from the gate 70 by a gap 76.

Figure 5B:
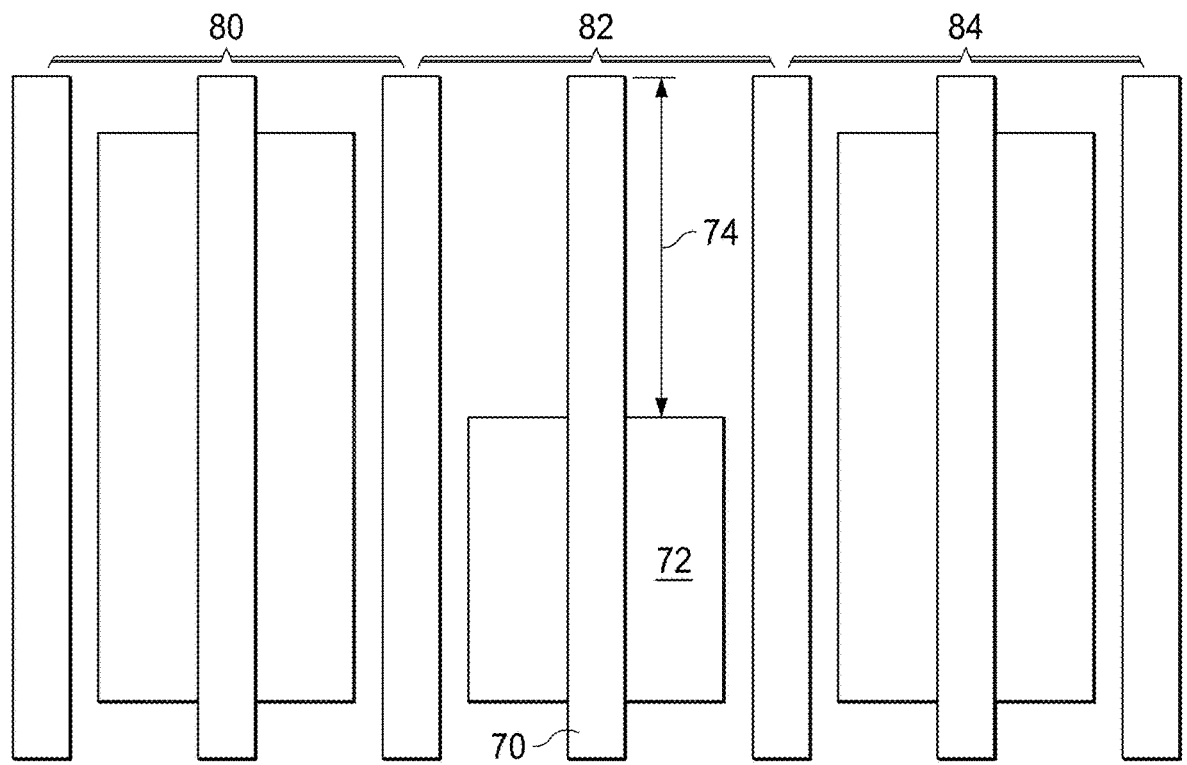

As is illustrated in FIG. 5B, the performance of the narrow NMOS transistor 82 may be enhanced by eliminating the gap 76 and joining the gate 70 to the OPC dummy gate extension 78 to increase the NMOS gate overhang 74 of active 72.

If desired, in a high performance integrated circuit technology with DSL, the gate overhang of active design rule may be larger for NMOS transistors than for PMOS transistors to take advantage of the improvement in NMOS transistor performance with increased gate overhang of active. This design rule may be in the base set of design rules or may be implemented in design for manufacturing (DFM) guidelines.

Vertically adjacent NMOS and PMOS transistor layout would appear as in FIG. 3 for these design rules when NMOS gate overhang of active 34, PMOS gate overhang of active 36, and gate tip-to-tip space 42 are all at minimum design rule. For example, a base design rule set for 28 nm technology may have NMOS gate overhang of active 34 design rule equal to 25 nm and PMOS gate overhang of active 36 design rule equal to 25 nm whereas the DFM design rules may have NMOS gate overhang of active 34 design rule in the range of 50 nn to 200 nm and PMOS gate overhang of active 36 design rule of 30 nm or less.

Some CMOS technologies that use double pattern for forming the transistor gate pattern. The first pattern is a dark geometry pattern which defines the gate length and the second pattern is a clear geometry pattern which separates the gates of vertically adjacent transistors. In this process the second pattern may be aligned to PMOS active to minimize the PMOS gate overhang of active 36 and to maximize the NMOS gate overhang of active 34, depending upon the location of a DSL boundary.

Those skilled in the art to which this invention relates will appreciate that many other embodiments and variations are possible within the scope of the claimed invention.

What is claimed is:

1. A method of forming an integrated circuit having a first and an adjacent second NMOS transistor and a first and an adjacent second PMOS transistor, comprising:
    forming a first NMOS gate of the first NMOS transistor and a second NMOS gate of the second NMOS transistor, wherein the first NMOS transistor has a first width smaller than a second width of the second NMOS transistor and the first NMOS gate and second NMOS gate have a same long side dimension;
    forming a first PMOS gate of the first PMOS transistor and a second PMOS gate of the second PMOS transistor, wherein the first PMOS transistor has a third width smaller than a fourth width of the second PMOS transistor and wherein forming the first PMOS gate forms an additional extension with a gap between a first edge of the extension and the first PMOS gate and a second opposite edge aligned with an edge of the second PMOS gate.

2. The method of claim 1, further comprising forming first and second stress liners on the integrated circuit where a dual stress liner (DSL) boundary between the first and second stress liners lies between an active area of the first NMOS transistor and an active area of the first PMOS transistor.

3. The method of claim 1, wherein the first NMOS gate crosses opposite NMOS edges of a NMOS active area and extends past a first of the opposite NMOS edges nearest the first PMOS transistor a first distance and wherein the first PMOS gate crosses opposite edges of a PMOS active area and extends past a first edge of the opposite PMOS edges nearest the NMOS transistor a second distance, wherein the first distance is greater than the second distance.

4. The method of claim 3, wherein the first distance is in the range of 50 nm to 200 nm.

5. The method of claim 1, wherein the first NMOS gate has the long side dimension in a vertical direction and the first NMOS transistor and the first PMOS transistor are vertically adjacent.

6. A method of forming an integrated circuit having a first and an adjacent second NMOS transistor and a first and an adjacent second PMOS transistor, comprising:
forming a first NMOS gate of the first NMOS transistor and a second NMOS gate of the second NMOS transistor, wherein forming the first NMOS gate forms a first optical proximity correction (OPC) extension continuous with the first NMOS gate;
forming a first PMOS gate of the first PMOS transistor and a second PMOS gate of the second PMOS transistor, wherein the first PMOS transistor has a third width smaller than a fourth width of the second PMOS transistor and wherein forming the first PMOS gate forms a second OPC extension with a gap between a first edge of the second OPC extension and the first PMOS gate.

7. The method of claim 6, wherein the first NMOS transistor has a first width smaller than a second width of the second NMOS transistor and the first PMOS transistor has a third width smaller than a fourth width of the second PMOS transistor.

8. The method of claim 7, wherein a first edge of the first NMOS gate is aligned with a first edge of the second NMOS gate and an opposite edge of the first OPC extension is aligned with a second edge of the second NMOS gate.

9. The method of claim 6, wherein the first PMOS gate has a second opposite edge aligned with an edge of the second PMOS gate.

10. The method of claim 6, further comprising forming first and second stress liners on the integrated circuit where a dual stress liner (DSL) boundary between the first and second stress liners lies between an active area of the first NMOS transistor and an active area of the first PMOS transistor.

11. An integrated circuit having a first and an adjacent second NMOS transistor and a first and an adjacent second PMOS transistor, comprising:
a first NMOS gate of the first NMOS transistor and a second NMOS gate of the second NMOS transistor, wherein the first NMOS transistor has a first width smaller than a second width of the second NMOS transistor;
a first optical proximity correction (OPC) extension continuous with the first NMOS gate;
a first PMOS gate of the first PMOS transistor and a second PMOS gate of the second PMOS transistor, wherein the first PMOS transistor has a third width smaller than a fourth width of the second PMOS transistor; and
a second OPC extension with a gap between a first edge of the second OPC extension and the first PMOS gate and a second opposite edge aligned with an edge of the second PMOS gate.

12. The integrated circuit of claim 11, wherein a first edge of the first NMOS gate is aligned with a first edge of the second NMOS gate and an opposite edge of the first OPC extension is aligned with a second edge of the second NMOS gate.

13. The integrated circuit of claim 11, further comprising first and second stress liners on the integrated circuit where a dual stress liner (DSL) boundary between the first and second stress liners lies between an active area of the first NMOS transistor and an active area of the first PMOS transistor.

14. An integrated circuit having a first and an adjacent second NMOS transistor and a first and an adjacent second PMOS transistor, comprising:
a first NMOS gate of the first NMOS transistor and a second NMOS gate of the second NMOS transistor, wherein the first NMOS transistor has a first width smaller than a second width of the second NMOS transistor and the first NMOS gate has a NMOS extension continuous with the first NMOS gate such that the first NMOS gate and the NMOS extension together have a same long side dimension as the second NMOS gate;
a first PMOS gate of the first PMOS transistor and a second PMOS gate of the second PMOS transistor, wherein the first PMOS transistor has a third width smaller than a fourth width of the second PMOS transistor; and
a PMOS extension for the first PMOS gate with a gap between a first edge of the PMOS extension and the first PMOS gate and a second opposite edge aligned with an edge of the second PMOS gate.

15. The method of claim 14, further comprising first and second stress liners on the integrated circuit where a dual stress liner (DSL) boundary between the first and second stress liners lies between an active area of the first NMOS transistor and an active area of the first PMOS transistor.

16. The method of claim 14, wherein the first NMOS gate crosses opposite NMOS edges of a NMOS active area and extends past a first of the opposite NMOS edges nearest the first PMOS transistor a first distance and wherein the first PMOS gate crosses opposite edges of a PMOS active area and extends past a first edge of the opposite PMOS edges nearest the NMOS transistor a second distance, wherein the first distance is greater than the second distance.

17. The method of claim 16, wherein the first distance is in the range of 50 nm to 200 nm.

18. The method of claim 14, wherein the first NMOS gate has the long side dimension in a vertical direction and the first NMOS transistor and the first PMOS transistor are vertically adjacent.

* * * * *